(12) United States Patent
Drost et al.

(10) Patent No.: US 8,476,749 B2
(45) Date of Patent: Jul. 2, 2013

(54) HIGH-BANDWIDTH RAMP-STACK CHIP PACKAGE

(75) Inventors: Robert J. Drost, Los Altos, CA (US);
James G. Mitchell, Palo Alto, CA (US);
David C. Douglas, Palo Alto, CA (US)

(73) Assignee: Oracle America, Inc., Redwood Shores, CA (US)

( * ) Notice: Subject to any disclaimer, the term of this patent is extended or adjusted under 35 U.S.C. 154(b) by 491 days.

(21) Appl. No.: 12/507,349

(22) Filed: Jul. 22, 2009

(65) Prior Publication Data

US 2011/0018120 A1 Jan. 27, 2011

(51) Int. Cl.
*H01L 23/02* (2006.01)

(52) U.S. Cl.
USPC ........... 257/686; 257/685; 257/777; 257/723; 257/691; 257/784

(58) Field of Classification Search
USPC .................................. 257/686–733, 777, 784
See application file for complete search history.

(56) References Cited

U.S. PATENT DOCUMENTS

| | | | |
|---|---|---|---|
| 4,500,905 A * | 2/1985 | Shibata ............................. | 257/74 |
| 4,879,588 A * | 11/1989 | Ohtsuka et al. ................. | 257/664 |
| 5,495,398 A * | 2/1996 | Takiar et al. ..................... | 361/790 |
| 5,703,436 A * | 12/1997 | Forrest et al. ................... | 313/506 |
| 5,998,864 A * | 12/1999 | Khandros et al. ............... | 257/723 |
| 6,215,182 B1 * | 4/2001 | Ozawa et al. ................... | 257/723 |
| 6,376,904 B1 * | 4/2002 | Haba et al. ...................... | 257/686 |
| 6,621,155 B1 * | 9/2003 | Perino et al. .................... | 257/686 |
| 6,858,938 B2 * | 2/2005 | Michii ............................. | 257/777 |
| 7,015,586 B2 * | 3/2006 | Chien .............................. | 257/777 |
| 7,211,885 B2 * | 5/2007 | Nordal et al. ................... | 257/686 |
| 7,262,506 B2 * | 8/2007 | Mess et al. ...................... | 257/777 |
| 7,348,668 B2 * | 3/2008 | Masuda et al. .................. | 257/723 |
| 7,375,419 B2 * | 5/2008 | Mess et al. ...................... | 257/686 |
| 7,420,269 B2 * | 9/2008 | Ha et al. .......................... | 257/686 |
| 7,420,281 B2 * | 9/2008 | Tsunozaki ....................... | 257/777 |
| 7,495,326 B2 * | 2/2009 | Rinne .............................. | 257/686 |
| 7,547,961 B2 * | 6/2009 | Nishizawa et al. ............. | 257/679 |
| 7,573,720 B1 * | 8/2009 | Drost et al. ..................... | 361/760 |
| 7,582,953 B2 * | 9/2009 | Lin .................................. | 257/666 |
| 7,582,963 B2 * | 9/2009 | Gerber et al. ................... | 257/723 |
| 7,592,691 B2 * | 9/2009 | Corisis et al. ................... | 257/686 |
| 7,615,853 B2 * | 11/2009 | Shen et al. ....................... | 257/676 |
| 7,633,146 B2 * | 12/2009 | Masuda et al. .................. | 257/679 |
| 7,663,246 B2 * | 2/2010 | Chen et al. ...................... | 257/777 |
| 7,704,794 B2 * | 4/2010 | Mess et al. ...................... | 438/112 |
| 7,755,175 B2 * | 7/2010 | Ishida et al. ..................... | 257/672 |
| 7,786,595 B2 * | 8/2010 | Shen et al. ....................... | 257/777 |
| 7,816,771 B2 * | 10/2010 | Shen et al. ....................... | 257/666 |

(Continued)

*Primary Examiner* — Telly Green
(74) *Attorney, Agent, or Firm* — Park, Vaughan, Fleming & Dowler, LLP; Steven E. Stupp

(57) ABSTRACT

A chip package is described. This chip package includes a stack of semiconductor dies or chips that are offset from each other, thereby defining a terrace with exposed pads. A high-bandwidth ramp component, which is positioned approximately parallel to the terrace, electrically couples to the exposed pads. For example, the ramp component may be electrically coupled to the semiconductor dies using: microsprings, an anisotropic film, and/or solder. Consequently, the electrical contacts may have a conductive, a capacitive or, in general, a complex impedance. Furthermore, the chips and/or the ramp component may be positioned relative to each other using a ball-and-pit alignment technique. By removing the need for costly and area-consuming through-silicon vias (TSVs) in the semiconductor dies, the chip package facilitates chips to be stacked in a manner that provides high bandwidth and low cost.

20 Claims, 13 Drawing Sheets

U.S. PATENT DOCUMENTS

| | | | |
|---|---|---|---|
| 7,855,446 B2 * | 12/2010 | Nishiyama et al. | 257/686 |
| 7,879,647 B2 * | 2/2011 | Masuda et al. | 438/109 |
| 7,911,045 B2 * | 3/2011 | Matsushima et al. | 257/686 |
| 7,952,183 B2 * | 5/2011 | Okada et al. | 257/686 |
| 7,998,792 B2 * | 8/2011 | Mess et al. | 438/112 |
| 7,999,378 B2 * | 8/2011 | Mess et al. | 257/723 |
| 8,049,342 B2 * | 11/2011 | Mess et al. | 257/777 |
| 2004/0142539 A1 | 7/2004 | Koizumi | |
| 2004/0155322 A1 * | 8/2004 | Cho et al. | 257/676 |
| 2004/0164391 A1 * | 8/2004 | Okamura | 257/686 |
| 2006/0290377 A1 * | 12/2006 | Kim et al. | 326/30 |
| 2007/0170572 A1 * | 7/2007 | Liu et al. | 257/686 |
| 2008/0174030 A1 * | 7/2008 | Liu et al. | 257/777 |
| 2008/0176358 A1 * | 7/2008 | Liu et al. | 438/109 |

* cited by examiner

HIGH-BANDWIDTH RAMP-STACK CHIP PACKAGE

GOVERNMENT LICENSE RIGHTS

The United States Government has a paid-up license in this invention and the right in limited circumstances to require the patent owner to license others on reasonable terms as provided for by the terms of Contract No. H98230-09-C-0267 awarded by the United States Department of Defense.

BACKGROUND

1. Field

The present disclosure generally relates to a semiconductor chip package. More specifically, the present disclosure relates to a chip package that includes a group of chips arranged in a stack, and a ramp component, which is at an angle relative to the stack, and which is coupled to the chips.

2. Related Art

Chip packages that include stacked semiconductor chips can provide higher performance and lower cost in comparison to conventional individually packaged chips that are connected to a printed circuit board. These chip packages also provide certain advantages, such as the ability: to use different processes on different chips in the stack, to combine higher density logic and memory, and to transfer data using less power. For example, a stack of chips that implements a dynamic random access memory (DRAM) can use a high-metal-layer-count, high-performance logic process in a base chip to implement input/output (I/O) and controller functions, and a set of lower metal-layer-count, DRAM-specialized processed chips can be used for the rest of the stack. In this way the combined set of chips may have better performance and lower cost than: a single chip that includes I/O and controller functions manufactured using the DRAM process; a single chip that includes memory circuits manufactured using a logic process; and/or attempting to use a single process to make both logic and memory physical structures.

Existing techniques for stacking chips include wire bonding and through-silicon vias (TSVs). Wire bonding is a low-bandwidth, low-cost technique in which chips are stacked offset from one another to define a staircase of chip edges that includes exposed bond pads. Electrical connections to the chips are implemented by bonding wires to these bond pads.

In contrast, TSVs typically have a higher bandwidth than wire bonds. In a TSV fabrication technique, chips are processed so that one or more of their metal layers on their active face is conductively connected to new pads on their back face. Then, chips are adhesively connected in a stack, so that the new pads on the back face of one chip make conductive contact with corresponding pads on the active face of an adjacent chip.

However, TSVs typically have a higher cost than wire bonds. This is because TSVs pass through the active silicon layer of a chip. As a consequence, a TSV occupies area that could have been used for transistors or wiring. This opportunity cost can be large. For example, if the TSV exclusion or keep-out diameter is 20 µm, and TSVs are placed on a 30-µm pitch, then approximately 45% of the silicon area is consumed by the TSVs. This roughly doubles the cost per area for any circuits in the chips in the stack. (In fact, the overhead is likely to be even larger because circuits are typically spread out to accommodate TSVs, which wastes more area.) In addition, fabricating TSVs usually entails additional processing operations, which also increases the chip cost.

Hence, what is needed is a chip package that offers the advantages of stacked chips without the problems described above.

SUMMARY

One embodiment of the present disclosure provides a chip package that includes a set of semiconductor dies arranged in a stack in a vertical direction, which is substantially perpendicular to a plane that is parallel to a first semiconductor die in the vertical stack. In this vertical stack, a given semiconductor die, after the first semiconductor die, is offset in a horizontal direction in the plane by an offset value from an immediately preceding semiconductor die in the vertical stack, thereby defining a stepped terrace at one side of the vertical stack. Furthermore, the chip package includes a ramp component, which is electrically and mechanically coupled to the semiconductor dies. This ramp component is positioned on the one side of the vertical stack, and is approximately parallel to a direction along the stepped terrace, which is between the horizontal direction and the vertical direction.

Note that the ramp component may be a passive component, such as a plastic substrate with metal traces to electrically couple to the semiconductor dies. Alternatively, the ramp component may be another semiconductor die. Furthermore, the ramp component may include an edge connector that is configured to remateably electrically and mechanically couple to a circuit board.

In some embodiments, the chip package includes a substrate under the first semiconductor die, which is approximately parallel to the plane, where the substrate is at least electrically coupled to the ramp component.

Furthermore, in some embodiments the chip package includes encapsulation surrounding the semiconductor dies and at least a portion of the ramp component.

Additionally, the ramp component may be soldered to each of the semiconductor dies. To facilitate soldering of the ramp component to the semiconductor dies, the semiconductor dies may include bumps. In order to accommodate mechanical alignment errors in the vertical direction, the height and pitch of the bumps may vary among the semiconductor dies along the vertical direction.

In some embodiments, the ramp component is electrically coupled to each of the semiconductor dies by microsprings and/or an anisotropic conductive film. To facilitate electrical coupling between the semiconductor dies and the ramp component, the semiconductor dies may include compression elements on top surfaces of the semiconductor dies that compress the anisotropic conductive film when the chip package is assembled.

Note that the ramp component may be mechanically coupled to the semiconductor dies without inserting the semiconductor dies into slots in the ramp component. In some embodiments, the ramp component facilitates communication of electrical signals and power signals to the semiconductor dies without through-chip vias in the semiconductor dies.

Furthermore, the ramp component may include mechanical stops for the semiconductor dies that facilitate assembly of the chip package.

Additionally, the electrical coupling between the ramp component and a given semiconductor die in the semiconductor dies may have a complex impedance, which includes an in-phase component and an out-of-phase component.

In some embodiments, the chip package includes an intermediate chip between at least two of the semiconductor dies in the vertical stack. This intermediate chip may transport heat generated by operation of at least one of the semiconductor dies along the horizontal direction.

In some embodiments, surfaces of the semiconductor dies include etch pits, and balls in the etch pits maintain relative alignment of the semiconductor dies in the vertical stack.

Another embodiment provides a computer system that includes the chip package.

Another embodiment provides an electronic device that includes the chip package.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a chip package, an electronic device that includes the chip package, and a computer system that includes the chip package are described. This chip package includes a stack of semiconductor dies or chips that are offset from each other, thereby defining a terrace with exposed pads. A high-bandwidth ramp component, which is positioned approximately parallel to the terrace, electrically couples to the exposed pads. For example, the ramp component may be electrically coupled to the semiconductor dies using: microsprings, an anisotropic film, and/or solder. Consequently, the electrical contacts may have a conductive, a capacitive or, in general, a complex impedance. Furthermore, the chips and/or the ramp component may be positioned relative to each other using a ball-and-pit alignment technique.

By removing the need for costly and area-consuming through-silicon vias (TSVs) in the semiconductor dies, the chip package may facilitate chips to be stacked in a manner that provides high bandwidth and low cost. For example, the cost may be reduced by avoiding the processing operations and the wasted area associated with TSVs in the semiconductor dies. Thus, the chips in the stack may be fabricated using standard processing. Furthermore, microsprings and/or an anisotropic film may have a lower cost and/or may offer improved reliability than wire bonding. Note that in embodiments where the mechanical and/or electrical coupling between the chips and the ramp component are remateable, the yield of the chip package may be increased by allowing rework (such as replacing a bad chip that is identified during assembly or burn-in).

In addition, the chip package can offer higher inter-component communication bandwidth than wire bonding. While TSVs in principle provide higher bandwidth, this typically requires a large number of TSVs that consume a significant percentage of the silicon area in the semiconductor dies. For a moderate number of TSVs, which waste less silicon area, the ramp component can offer comparable inter-component communication bandwidth.

Figure 1A:
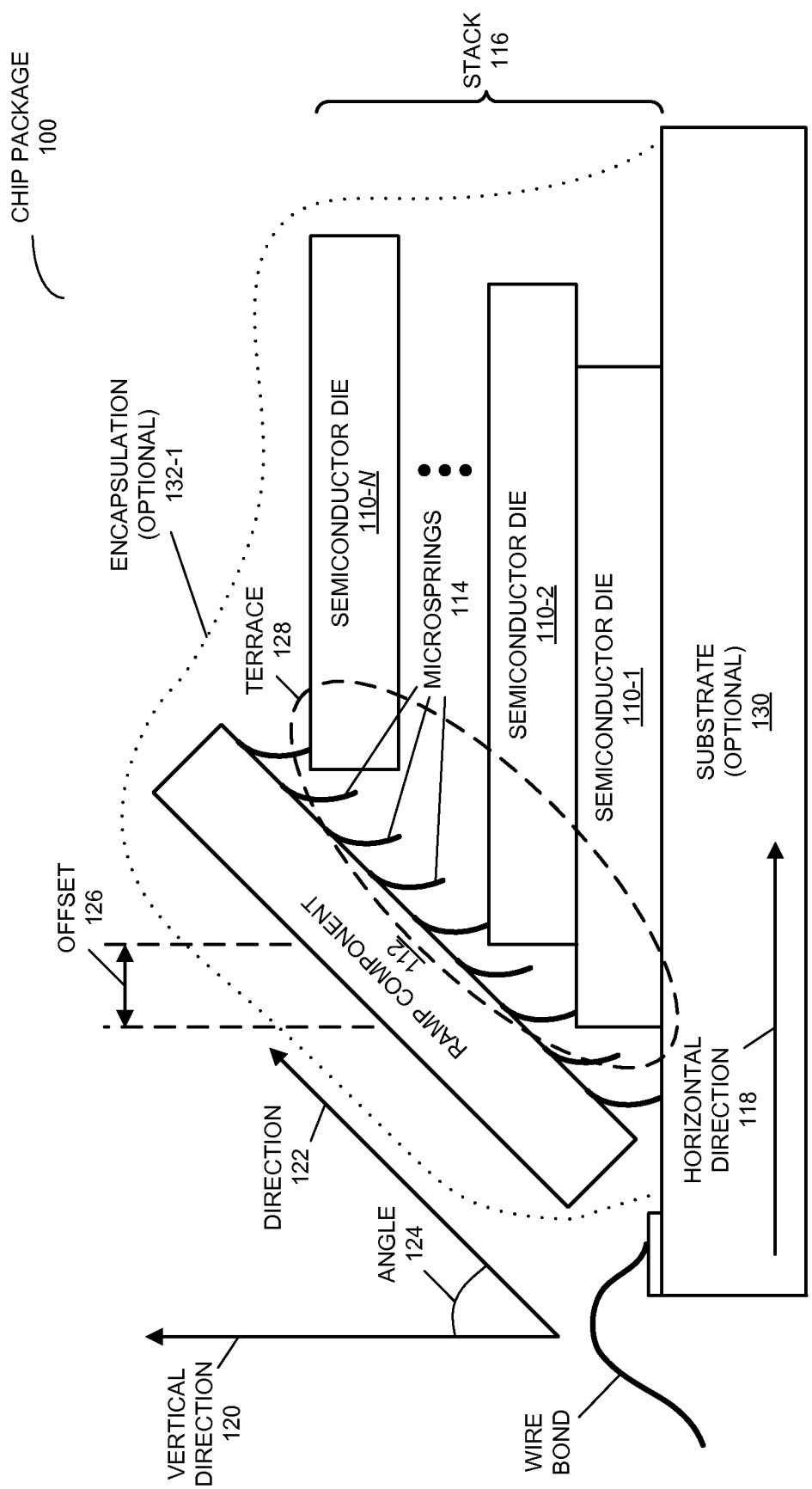
FIG. 1A is a block diagram illustrating a chip package in accordance with an embodiment of the present disclosure.

We now describe embodiments of a chip package. FIG. 1A presents a block diagram illustrating a side view of chip package 100 that includes a set of chips or semiconductor dies 110 arranged in a stack 116 along a vertical direction 120, which is substantially perpendicular to a plane that is parallel to semiconductor die 110-1. In this vertical stack, each semiconductor die after semiconductor die 110-1 (such as semiconductor die 110-2) may be offset in a horizontal direction 118 in the plane by at least a minimum offset value 126 from an immediately preceding semiconductor die in vertical stack 116, thereby defining a stepped terrace 128 at one side of vertical stack 116 (having a constant angle 124). Furthermore, chip package 100 includes a ramp component 112, which is electrically and mechanically coupled to semiconductor dies 110. This ramp component is positioned on the one side of vertical stack 116, and is approximately parallel to a direction 122 along stepped terrace 128, which is between horizontal direction 118 and vertical direction 120.

In some embodiments, semiconductor dies 110 are fabricated using standard silicon processing. In particular, in these embodiments semiconductor dies 110 do not include TSVs. These semiconductor dies may provide silicon area that supports logic and/or memory functionality.

Furthermore, semiconductor dies 110 may communicate with each other, and with an external device(s) or system(s), via ramp component 112. In particular, as illustrated in FIG. 1A, ramp component 112 may be electrically coupled to each of semiconductor dies 110 via microsprings 114. Note that microsprings 114 can be fabricated on a wide variety of surfaces, including: a printed circuit board (PCB), an organic or ceramic integrated circuit (IC), and/or on the surface of a semiconductor die. Moreover, microsprings 114 can be fabricated with an areal density of inter-chip connections that exceeds the density of input/output (I/O) signals on high performance ICs, and the compliance of microsprings 114 can increase the tolerance to mechanical movement and misalignment of components in chip package 100.

Microsprings 114 can also provide mechanical and electrical contacts without the use of solder. Thus, the mechanical and/or the electrical coupling between ramp component 112 and semiconductor dies 110 can be removable or remateable (i.e., these components can be remateably coupled), which facilitates rework of chip package 100 during and/or after assembly and test. Note that remateable mechanical or electrical coupling should be understood to be mechanical or electrical coupling that can be established and broken repeatedly (i.e., two or more times) without requiring rework or heating (such as with solder). In some embodiments, the remateable mechanical or electrical coupling involves male and female components that designed to couple to each other (such as components that snap together). Thus, remateable components are components that are configured to allow remateable coupling to be established. However, as described further below with reference to FIG. 2B, in some embodiments the mechanical and/or the electrical coupling between ramp component 112 and semiconductor dies 110 is more permanent (for example, it may not be remateable, such as solder contacts).

Note that ramp component 112 may be a passive component, such as a plastic substrate with metal traces to electrically couple to semiconductor dies 110. For example, ramp component 112 may be fabricated using injection-molded plastic. Alternatively, ramp component 112 may be another semiconductor die with lithographically defined wires or signal lines. In embodiments where ramp component 112 includes a semiconductor die, active devices, such as limit amplifiers, may be included to reduced cross-talk between the signal lines. Additionally, cross-talk may be reduced in either an active or a passive ramp component 112 using differential signaling.

In some embodiments, ramp component 112 includes transistors and wires that shuttle data and power signals among semiconductor dies 110 via microsprings 114. For example, ramp component 112 may include high-voltage signals. These signals may be stepped down for use on semiconductor dies 110 using: a step-down regulator (such as a capacitor-to-capacitor step-down regulator), as well as capacitor and/or inductor discrete components to couple to semiconductor dies 110.

In some embodiments, chip package 100 includes an optional substrate 130 under semiconductor die 110-1, which is approximately parallel to the plane. This optional substrate 130 is at least electrically coupled to ramp component 112 (which may facilitate communication of electrical or power signals with semiconductor dies 110 without using TSVs in semiconductor dies 110), and may be rigidly mechanically coupled to semiconductor die 110-1. Moreover, optional substrate 130 may include: a buffer or logic chip for memory, and/or input/output (I/O) to external device(s) and/or system(s). For example, the I/O may include one or more ball-bonds or wire bonds (as illustrated in FIG. 1A).

Note that there may be optional encapsulation 132-1 around at least a portion of chip package 100.

Figure 1B:
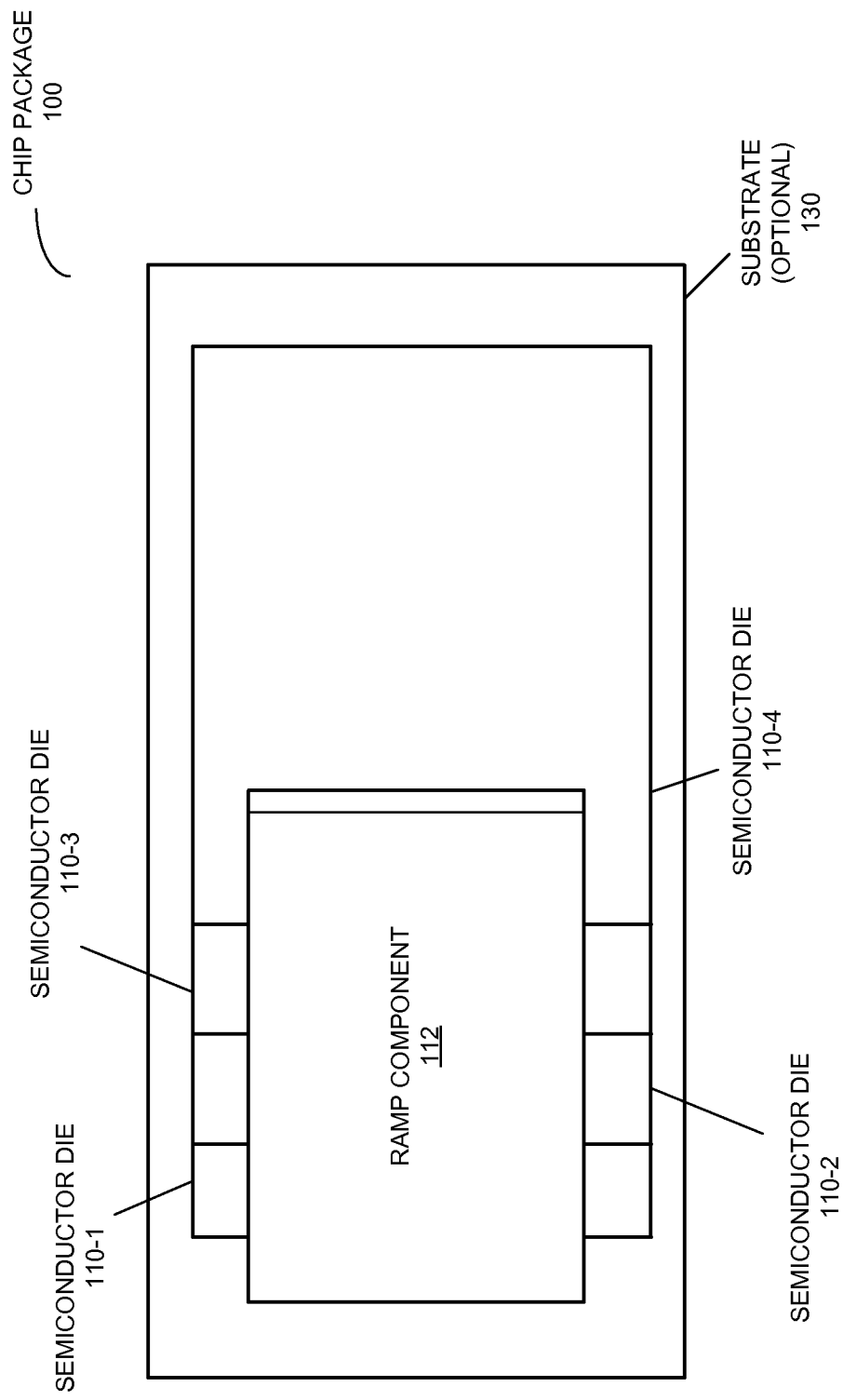
FIG. 1B is a block diagram illustrating a chip package in accordance with an embodiment of the present disclosure.

FIG. 1B presents a block diagram illustrating a top view of chip package 100, with four semiconductor dies 110. This figure shows that optional substrate 130 may extend beyond stack 116 (FIG. 1A) so that up to four edges of optional substrate 130 may be accessible for communication, using: wire bonding, ball-bonds, and/or proximity communication (PxC).

In general, semiconductor dies 110 and ramp component 112, ramp component 112 and optional substrate 130, optional substrate 130 and external device(s) or system(s), and/or ramp component 112 and external device(s) or system (s) may communicate with each other using PxC of electromagnetically coupled signals (which is referred to as 'electromagnetic proximity communication'), such as capacitively coupled signals and/or proximity communication of optical signals (which are, respectively, referred to as 'electrical proximity communication' and 'optical proximity communication'). In some embodiments, the electromagnetic proximity communication includes inductively coupled signals and/or conductively coupled signals.

Therefore, the impedance associated with electrical contacts between microsprings 114 and semiconductor dies 110 may be conductive (i.e., in-phase) and/or capacitive (i.e., out-of-phase), such as when there is a passivation layer (e.g., a glass layer) above metal pads on or proximate to surfaces of semiconductor dies 110. In general, the impedance may be complex, which includes an in-phase component and an out-of-phase component. Regardless of the electrical contact mechanism (such as microsprings 114, an anisotropic layer described below with reference to FIG. 2A, or solder described below with reference to FIG. 2B), if the impedance associated with the contacts is conductive, conventional transmit and receive I/O circuits may be used in components in chip package 100. However, for contacts having a complex (and, possibly, variable) impedance, the transmit and receive I/O circuits may include one or more embodiments described in U.S. patent application Ser. No. 12/425,871, entitled "Receive Circuit for Connectors with Variable Complex Impedance," by Robert J. Drost et al., filed on Apr. 17, 2009, the contents of which are hereby incorporated by reference.

Note that in some embodiments there may be two or more microspring 114 geometries on a given semiconductor die. For example, data-signal microsprings may be short with blunt ends, while power-signal microsprings may be longer with sharper tips. In addition, by including redundant power-signal microsprings, yield and long-term reliability may be enhanced even if some number of the power-signal microsprings lose their connections.

In order to increase the capacitance of the contacts, in some embodiments a conductive liquid, paste or film may be added to the contact area to fill in any gaps. This would also have the beneficial effect of increasing the area of overlap to the extent that the liquid, paste or film extends beyond the edges of the given microspring.

While FIGS. 1A and 1B illustrate a particular configuration of chip package 100, a number of techniques and configurations may be used to implement: electrical contact, mechanical alignment, assembly, and/or electrical I/O with ramp component 112 and/or optional substrate 130. We now describe several of these embodiments.

Figure 2A:
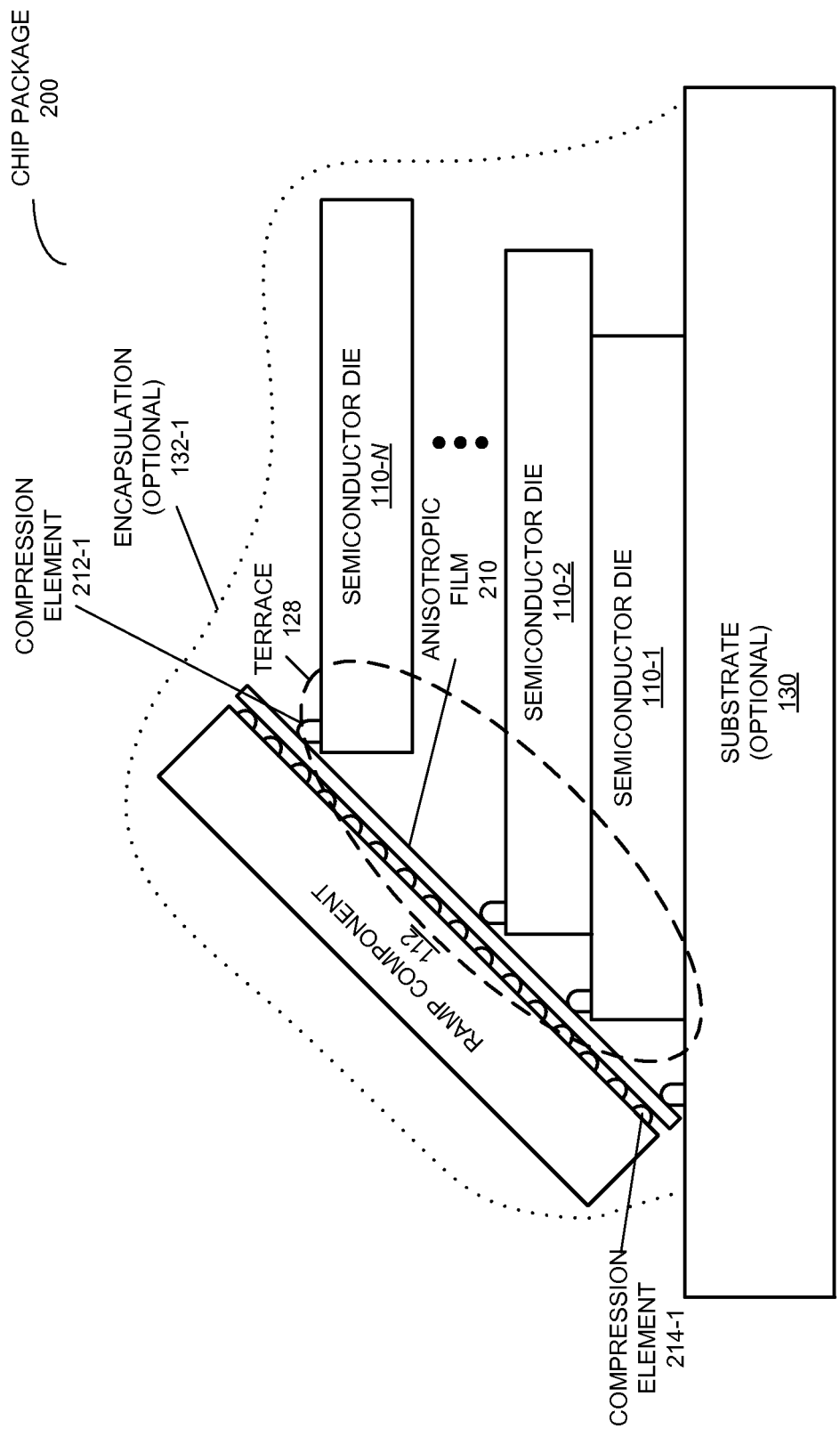
FIG. 2A is a block diagram illustrating a chip package in accordance with an embodiment of the present disclosure.

FIG. 2A presents a block diagram illustrating a chip package 200 in which ramp component 112 is electrically coupled to semiconductor dies 110 by an anisotropic film 210, such as an anisotropic elastomer film (which is sometimes referred to as an 'anisotropic conductive film'). Note that the anisotropic properties of anisotropic film 210 enhance electrical conductivity normal to the surface of anisotropic film 210 while also diminishing electrical conductivity tangential to the surface of anisotropic film 210. As a result, anisotropic film 210 electrically couples mechanically aligned pads on opposite faces of anisotropic film 210.

For example, anisotropic film 210 may include the Pari-Poser® material (from Paricon Technologies, Inc., of Fall River, Mass.), as well as a number of patented anisotropic films, including: U.S. Pat. No. 5,624,268, entitled "Electrical Conductors Using Anisotropic Conductive Films," and U.S. Pat. No. 4,778,950, entitled "Anisotropic Elastomeric Interconnecting System." In a PariPoser-type of anisotropic conductive elastomer film, small conductive balls are suspended in a silicone rubber such that the balls generally line up into columns and provide conduction normal, but not tangential, to the surfaces of anisotropic film. As with microsprings 114 (FIG. 1A), in general the impedance of the resulting electrical contacts may be conductive and/or capacitive. If the impedance is conductive, conventional transmit and receive I/O circuits may be used in components in chip package 200. However, if the impedance is complex, the transmit and receive I/O circuits in chip package 200 may include one or more embodiments described in U.S. patent application Ser. No. 12/425,871.

In some embodiments, electrical coupling between semiconductor dies 110 and ramp component 112 via anisotropic film 210 is facilitated using compression elements on top surfaces of semiconductor dies 110 and/or ramp component 112 (for example, compression elements 212-1 and 214-1) that compress anisotropic film 210 when chip package 200 is assembled.

Figure 2B:
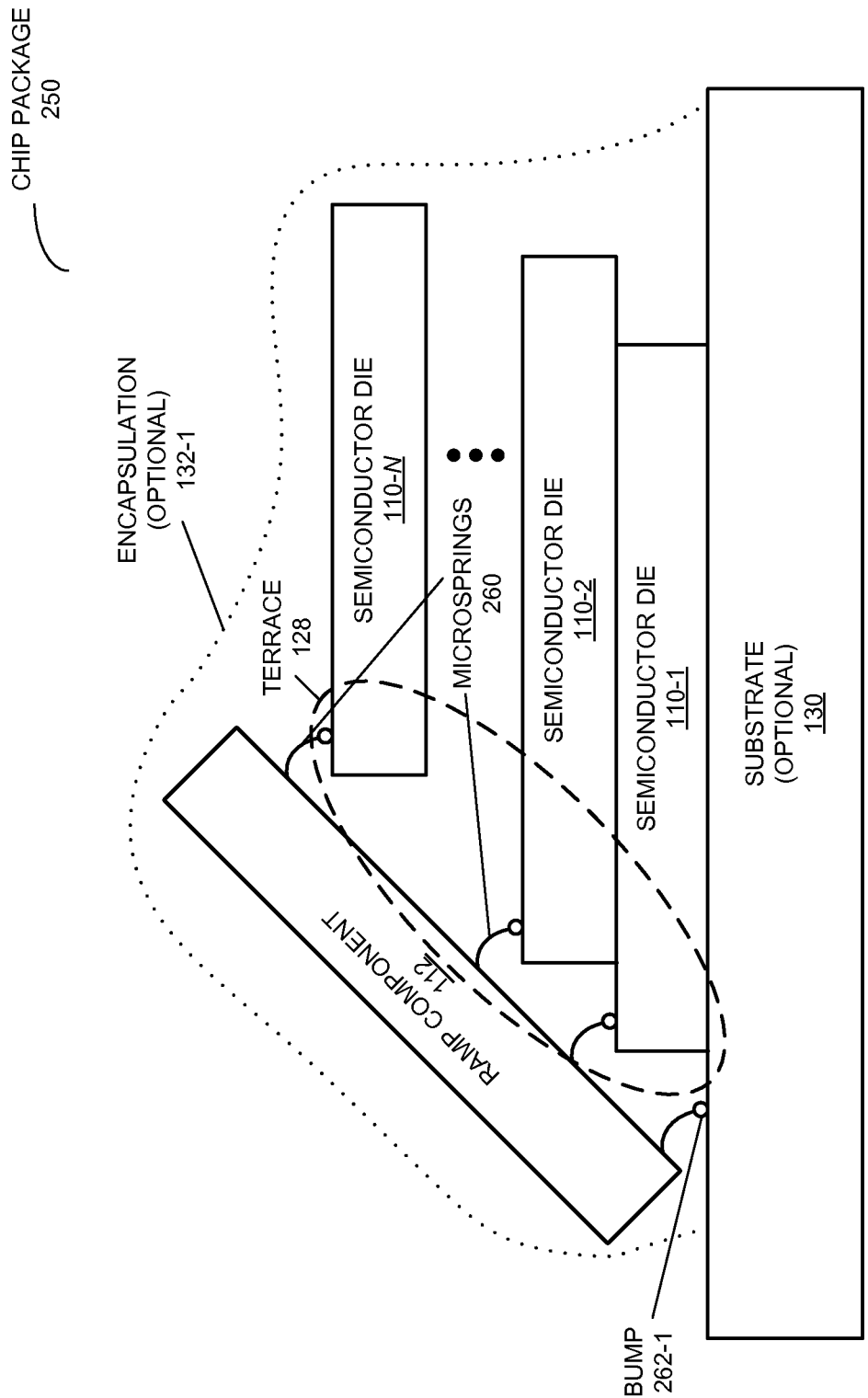
FIG. 2B is a block diagram illustrating a chip package in accordance with an embodiment of the present disclosure.

Alternatively, as shown in FIG. 2B, which presents a block diagram illustrating a chip package 250, electrical contact between ramp component 112 and semiconductor dies 110 may be implemented using solder (such as a reflowable solder layer). For example, microsprings 260 (or wires) may be soldered to bumps, such as bump 262-and-etch-pit 1, on the surfaces of semiconductor dies 110. In order to accommodate mechanical alignment errors in vertical direction 120 (FIG. 1A), the height and pitch of the bumps may vary among semiconductor dies 110 along vertical direction 120 (FIG. 1A). In an exemplary embodiment, after ramp component 112 is mechanically positioned relative to semiconductor dies 110 and/or optional substrate 130, chip package 250 is heated and the solder is reflowed, forming solder joints between microsprings 260 and the semiconductor dies 110 and/or optional substrate 130.

Figure 3A:
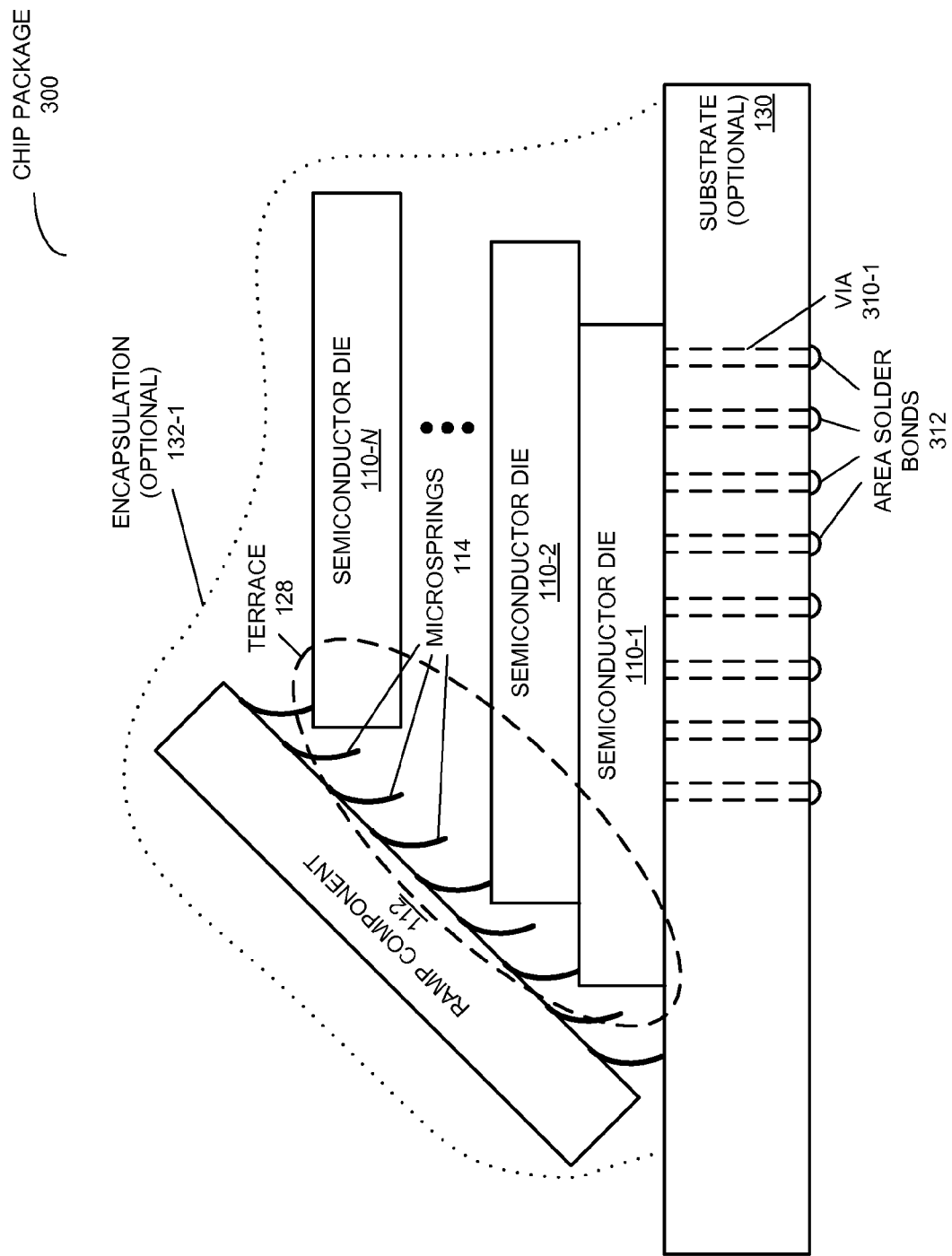
FIG. 3A is a block diagram illustrating a chip package in accordance with an embodiment of the present disclosure.

While there may not be TSVs in semiconductor dies 110, in some embodiments TSVs are included in optional substrate 130. This is shown in FIG. 3A, which presents a block diagram illustrating a chip package 300. Area solder bonds 312 may be used to electrically couple optional substrate 130 to other semiconductor die(s) and/or PCB(s). In general, there is a tradeoff in cost and performance between wire bonding and TSVs (with area solder bonding) for optional substrate 130. In contrast to semiconductor dies 110 in the stack, the added cost may be more tolerable in optional substrate 130 because it is often a more expensive chip that is used once per chip package. It is also conceivable that a combination of wire bonds and TSVs could be used on the same optional substrate 130.

Figure 3B:
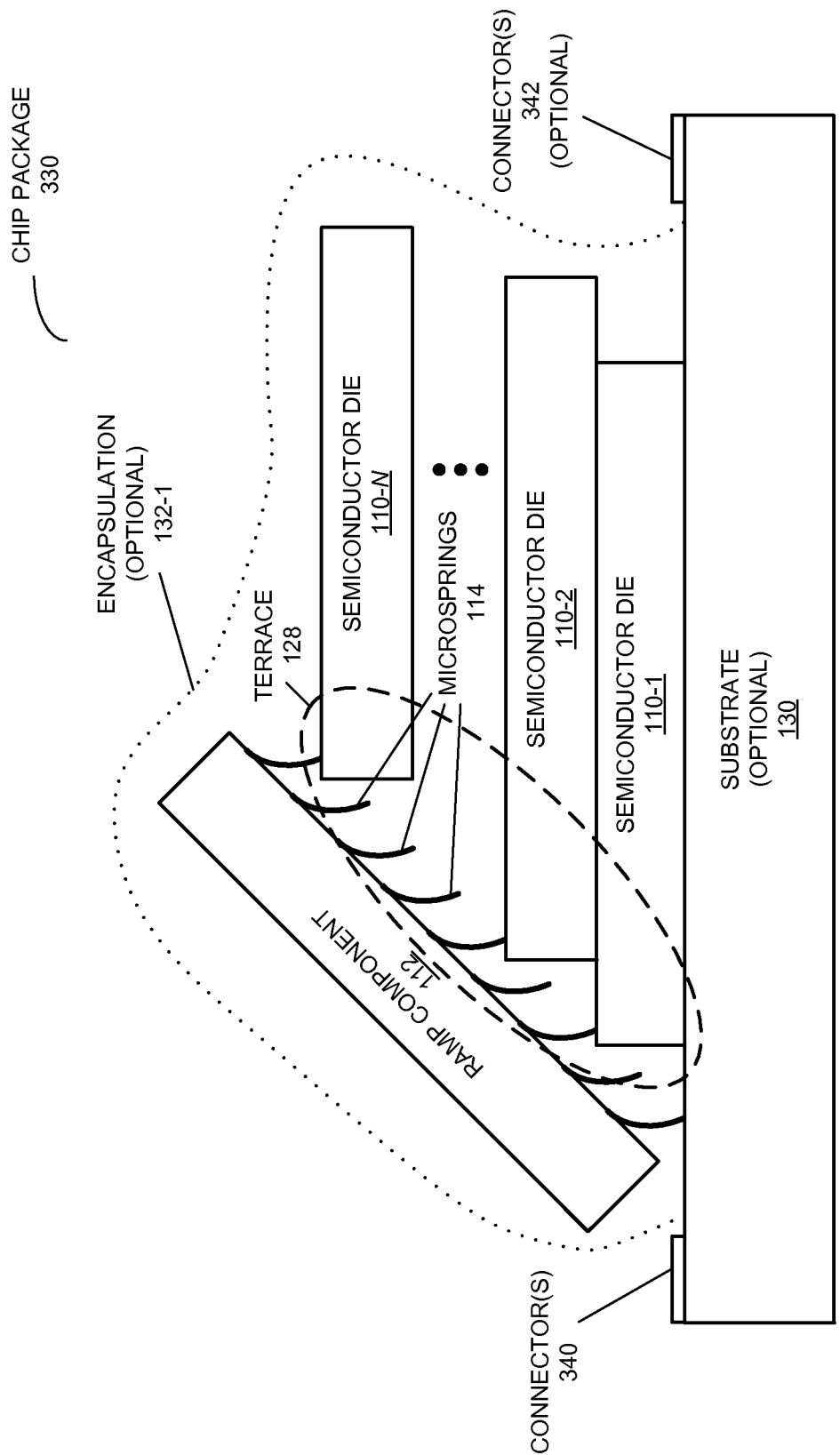
FIG. 3B is a block diagram illustrating a chip package in accordance with an embodiment of the present disclosure.

Furthermore, while FIG. 1A illustrated wire bonding to optional substrate 130, in other embodiments optional substrate 130 includes connectors. This is shown in FIG. 3B, which presents a block diagram illustrating a chip package 330 with connector(s) 340 on one end and optional connector(s) 342 on the other. These connectors may include an edge connector that is configured to remateably electrically and mechanically couple to a PCB. Alternatively or additionally, the connectors may include PxC connectors.

Figure 3C:
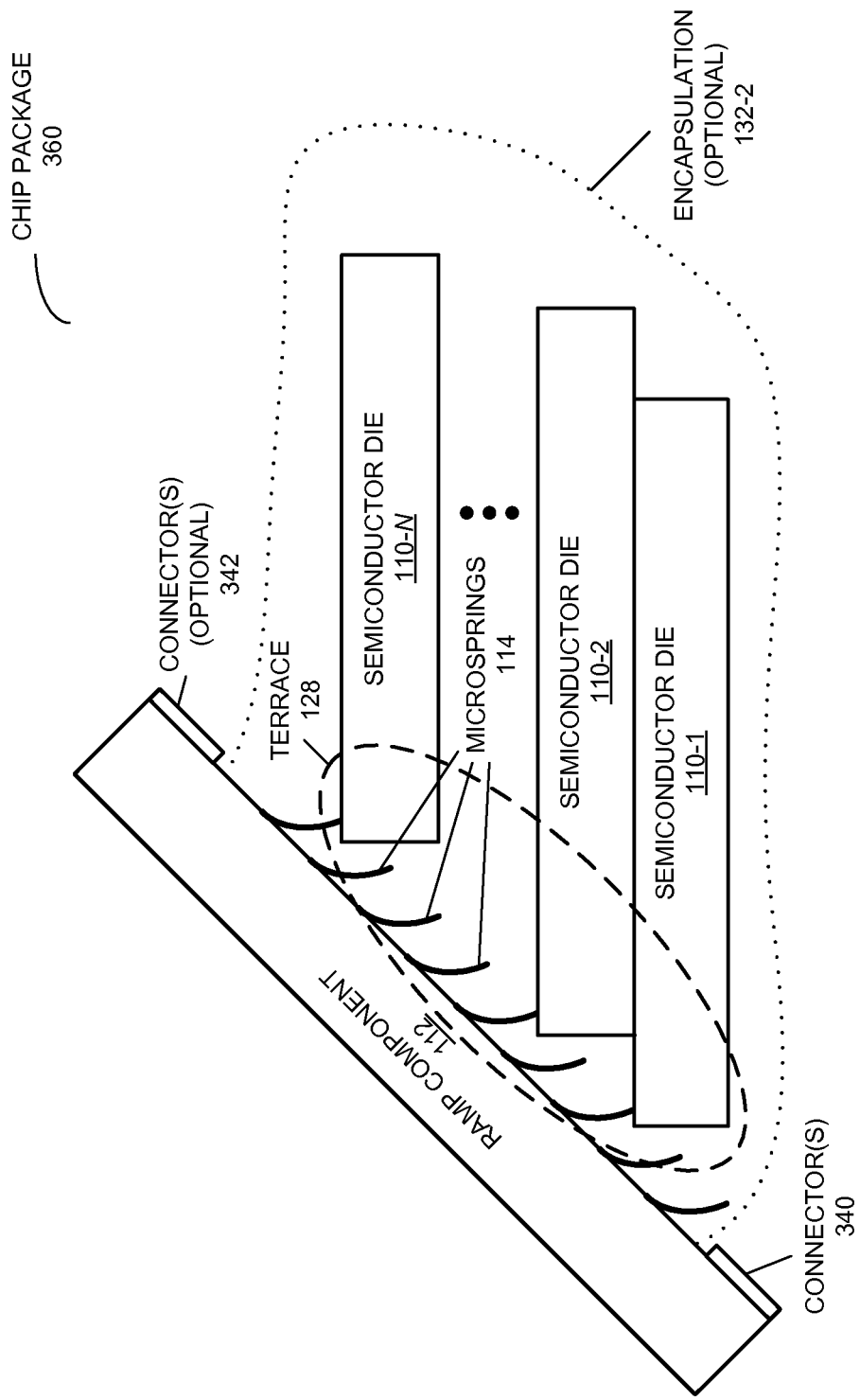
FIG. 3C is a block diagram illustrating a chip package in accordance with an embodiment of the present disclosure.

In some embodiments, connector(s) 340 and/or optional connector(s) 342 are included on a front and/or a back surface of ramp component 112. This is shown in FIG. 3C, which presents a block diagram illustrating a chip package 360.

Figure 3D:
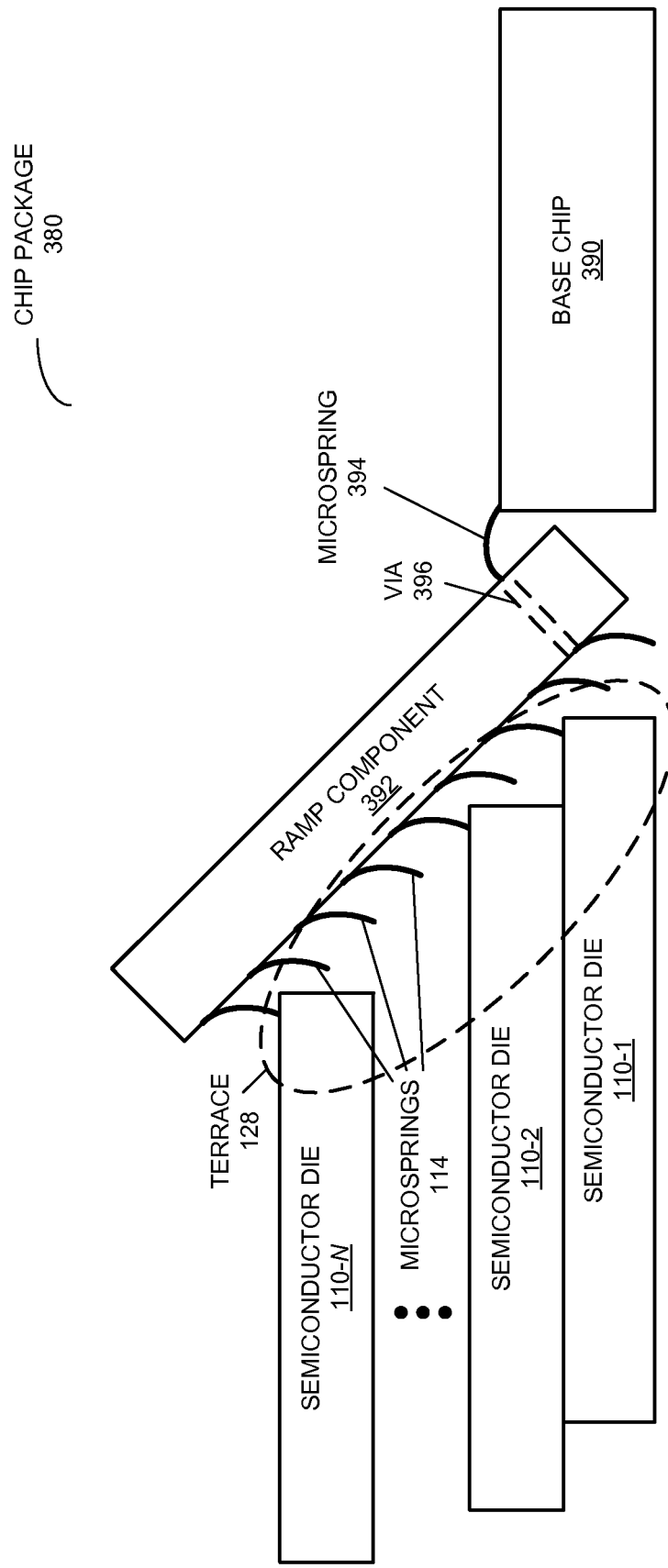
FIG. 3D is a block diagram illustrating a chip package in accordance with an embodiment of the present disclosure.

Another configuration is shown in FIG. 3D, which presents a block diagram illustrating chip package 380. In this chip package, a base chip 390 is coupled to ramp component 392 by one or more microsprings (such as microspring 394) on a back surface of ramp component 392. These microsprings are electrically coupled to microsprings 114, and thus to semiconductor dies 112, by one or more vias (such as via 396) through ramp component 392.

Figure 4A:
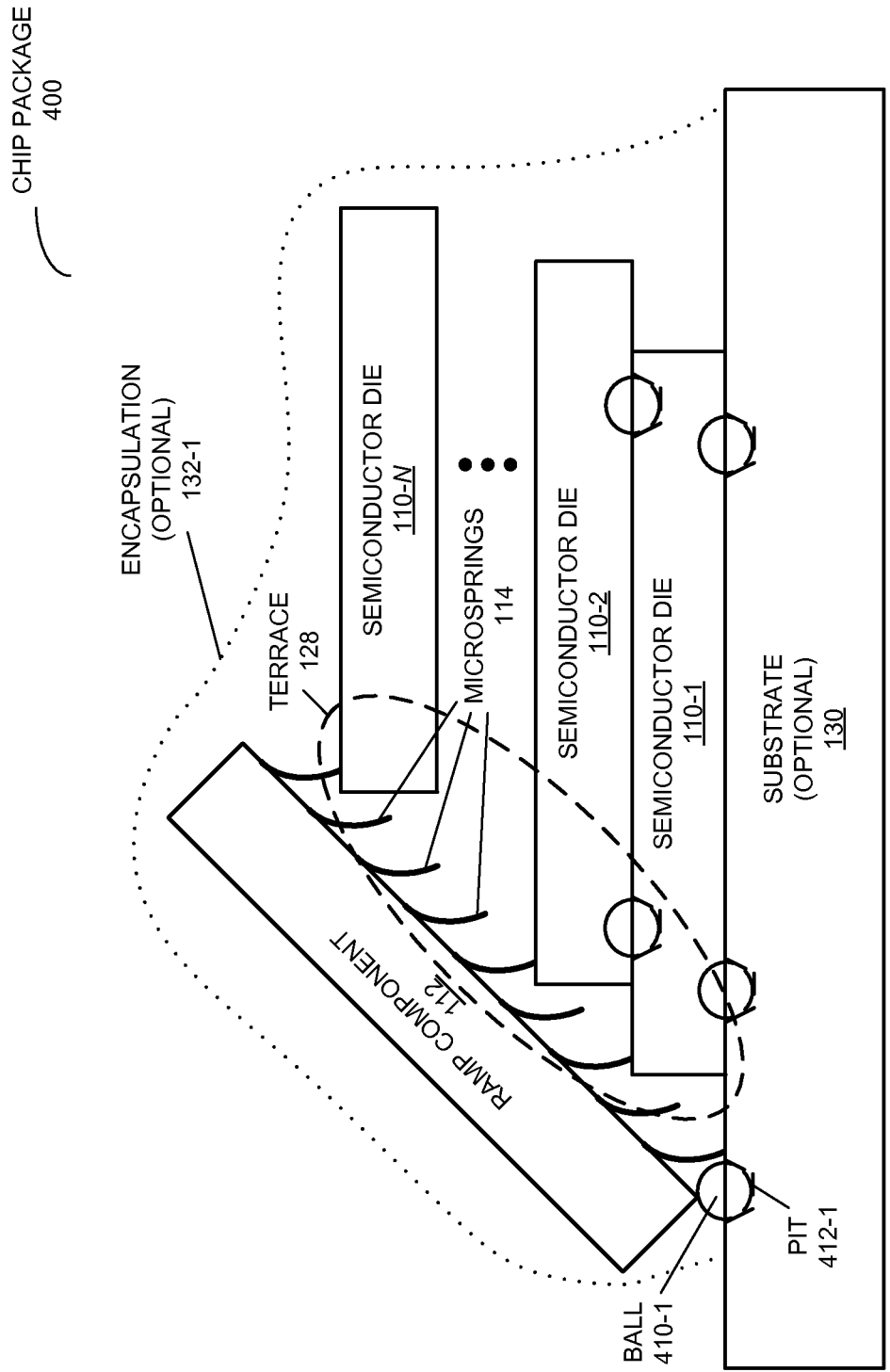
FIG. 4A is a block diagram illustrating a chip package in accordance with an embodiment of the present disclosure.

As noted previously, a wide variety of alignment techniques may be used in the embodiments of the chip package. One alignment technique involves the use of etch pits in conjunction with balls in the etch pits to maintain relative alignment of semiconductor dies 110 in the stack. This is shown in FIG. 4A, which presents a block diagram illustrating a chip package 400 that includes balls (such as ball 410-1) and associated pits (such as pit 412-1). The ball-and-etch-pit alignment technique can align the surfaces of semiconductor dies 110 and/or optional substrate 130 with mechanical tolerances of less than a micron under slight pressure that snaps the surfaces together. Before applying this pressure, pick-and-place machines can be used to achieve mechanical tolerances of less than 10 µm when placing components together. With a little additional time (and resulting assembly cost), these machines can align the components with mechanical tolerances of less than a micron. Given these initial alignments, it is possible to then adhere the optional substrate 130 and semiconductor dies 110 to form a spatially well-defined terrace 128 among semiconductor dies 110. In this example, it may be sufficient to align ramp component 112 to optional substrate 130 or to at least one of semiconductor dies 110.

For example, a minimal arrangement may use two pits to fix the x-y position of the surface of ramp component 112 to optional substrate 130 and to the group of semiconductor dies 110. A mechanical force applied to the backs of ramp component 112 and optional substrate 130 would then press ramp component 112 into contact with optional substrate 130 and semiconductor dies 110. However, thermal distortions and other mechanical forces may prevent a weakly adhesive technique from providing a robust long-term chip-packaging technique. While strong, permanent-adhesion of optional substrate 130 and semiconductor dies 110 is robust, it may prevent rework during assembly and test and/or after deployment. In general, packaging techniques that allow some rework are more cost-effective when faced with lower semiconductor-die yields or high expense to test extensively before packaging and assembly. Thus, there may be advantages to packaging techniques that avoid strong adhesives.

In chip package 400, balls and pits are used to align ramp component 112, as well as optional substrate 130 and semiconductor dies 110. In this arrangement, none of the components may require permanent or weak adhesives. In addition to the ball-and-etch-pit alignment technique, a related hemisphere-shaped bump-and-pit technique may be used to align the components in combination with or in substitution for any of the balls and etch pits. More generally, any combination of mechanically locking positive and negative surface features on ramp component 112, optional substrate 130 and/or semiconductor dies 110 may align the components without or in combination with adhesives.

Note that in some embodiments electronic alignment techniques are used to correct for planar mechanical misalignments in a chip package. For example, electronic alignment may be used with conductive and/or capacitive contacts if a given microspring contacts an array of transmit or receive micropads or microbars.

Figure 4B:
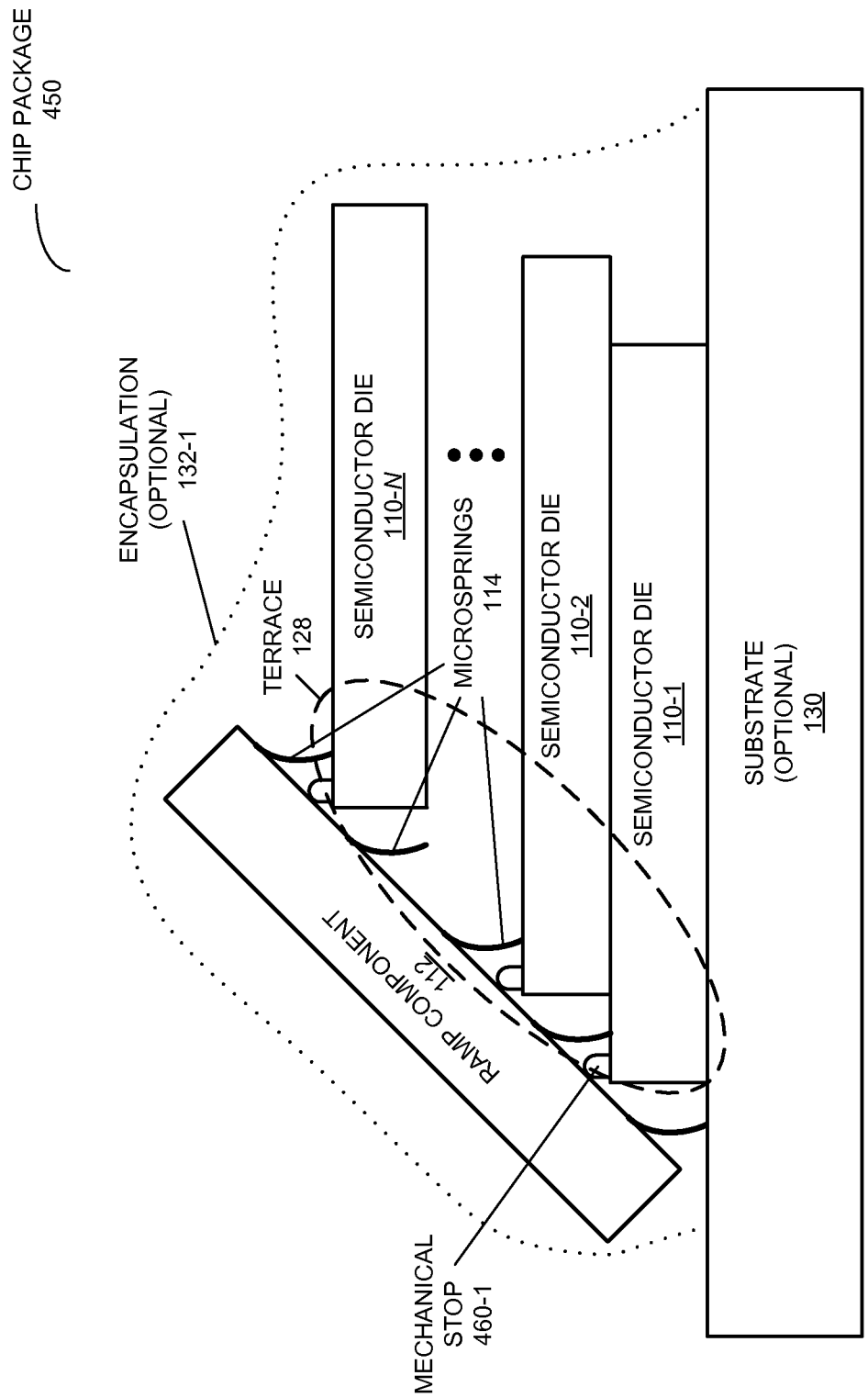
FIG. 4B is a block diagram illustrating a chip package in accordance with an embodiment of the present disclosure.

In some embodiments, ramp component 112 includes features that facilitate assembly of a chip package. This is shown in FIG. 4B, which presents a block diagram illustrating a chip package 450 that includes mechanical stops, such as mechanical stop 460-1 on semiconductor dies 110. For example, the mechanical stops may be fabricated using polyimide. By pushing semiconductor dies 110 against ramp component 112 along the horizontal direction 118 (FIG. 1A), these mechanical stops may facilitate good mechanical contact between semiconductor dies 110 and ramp component 112. In addition, the mechanical stops may reduce sensitivity to rough (and possibly poorly defined) edges of semiconductor dies 110. In some embodiments, ramp component 112 mechanically couples to semiconductor dies 110 without inserting semiconductor dies 110 into slots in ramp component 112.

Figure 5:
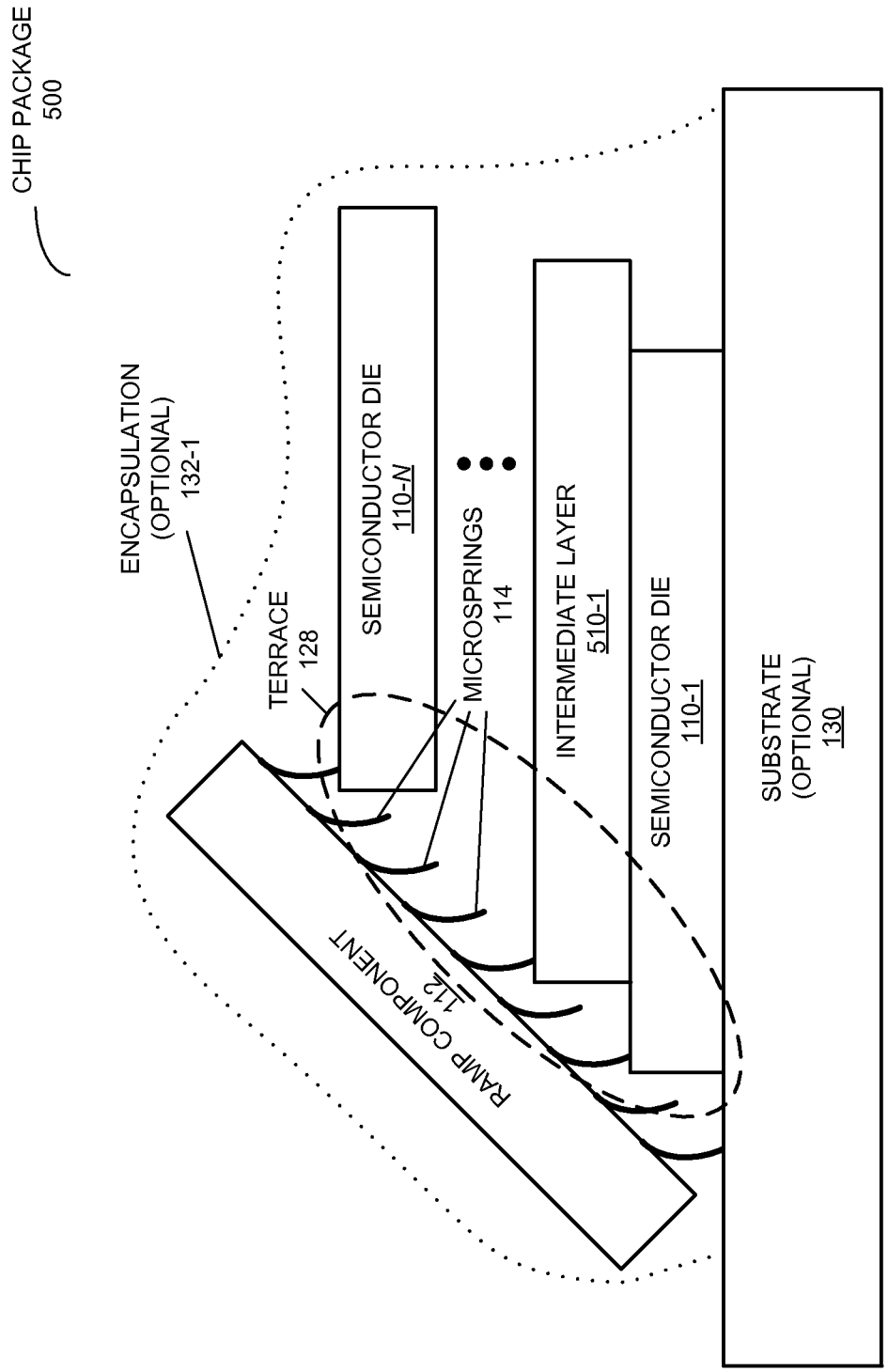
FIG. 5 is a block diagram illustrating a chip package in accordance with an embodiment of the present disclosure.

In some embodiments, a chip package includes features to remove heat generated during operation of circuits on one or more semiconductor dies 110, ramp component 112 and/or optional substrate 130. This is shown in FIG. 5, which presents a block diagram illustrating a chip package 500. In particular, chip package 500 includes an intermediate chip or layer 510 between at least two of semiconductor dies 110. This intermediate chip may transport heat generated by operation of at least the one of the semiconductor dies along horizontal direction 118 (FIG. 1A). Furthermore, heat transport may be facilitated by micro-fluidics on intermediate chip 5 10. Note that in some embodiments, intermediate chip 510 can also reduce cross-talk between two or more semiconductor dies 110.

In an exemplary embodiment, stack 116 (FIG. 1A) contains DRAMmemory cells and some of the support circuits for those memory cells. Furthermore, optional substrate 130 contains I/O circuits and/or additional DRAM support circuits (such as circuits to select bit, row, column, block, and/or bank, as well as chip redundancy). Alternatively or additionally, stack 116 (FIG. 1A) may contain static random access memory (SRAM) macros and some of the support circuits for those macros. In these embodiments, optional substrate 130 may include additional SRAM support circuits (such as redundancy), as well as switch and I/O circuits.

Figure 6:
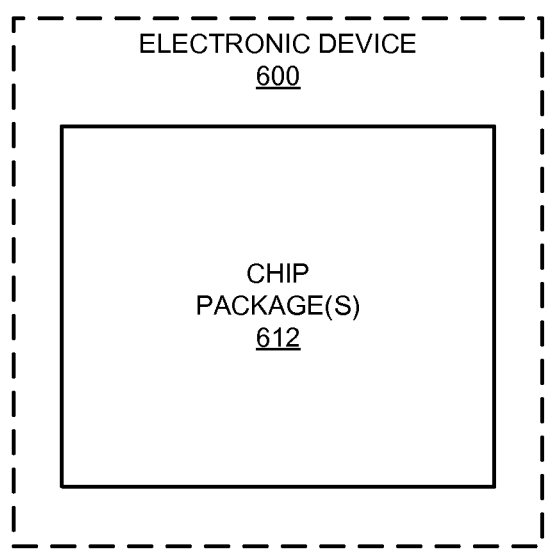
FIG. 6 is a block diagram illustrating an electronic device that includes one or more chip packages in accordance with an embodiment of the present disclosure.

We now describe embodiments of an electronic device and a computer system. FIG. 6 presents a block diagram illustrating an electronic device 600 that includes one or more chip packages 612, such as one of the previous embodiments of a chip package.

Figure 7:
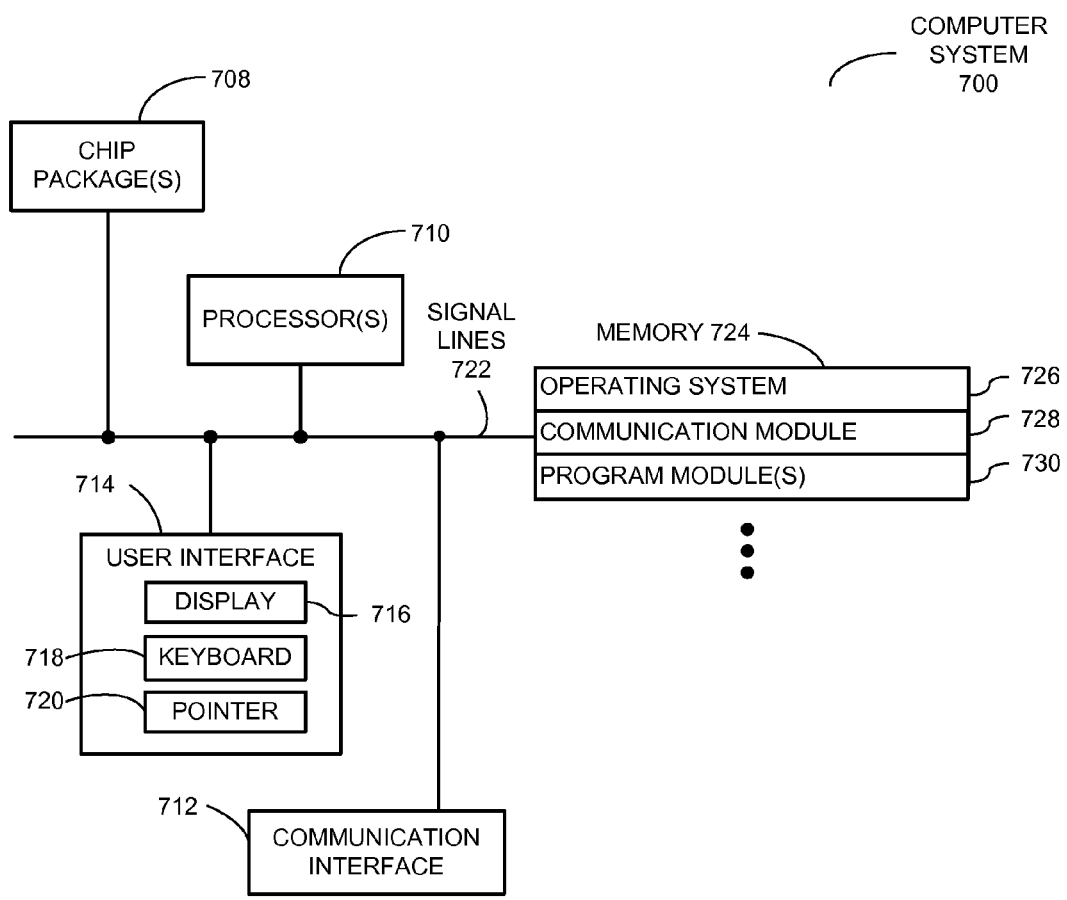
FIG. 7 is a block diagram illustrating a computer system that includes one or more chip packages in accordance with an embodiment of the present disclosure.

FIG. 7 presents a block diagram illustrating a computer system 700 that includes one or more chip packages 708, such as one of the previous embodiments of a chip package. Computer system 700 includes: one or more processors (or processor cores) 710, a communication interface 712, a user interface 714, and one or more signal lines 722 coupling these components together. Note that the one or more processors (or processor cores) 710 may support parallel processing and/or multi-threaded operation, the communication interface 712 may have a persistent communication connection, and the one or more signal lines 722 may constitute a communication bus. Moreover, the user interface 714 may include: a display 716, a keyboard 718, and/or a pointer 720, such as a mouse.

Memory 724 in the device 700 may include volatile memory and/or non-volatile memory. More specifically, memory 724 may include: ROM, RAM, EPROM, EEPROM, flash, one or more smart cards, one or more magnetic disc storage devices, and/or one or more optical storage devices. Memory 724 may store an operating system 726 that includes procedures (or a set of instructions) for handling various basic system services for performing hardware-dependent tasks. Moreover, memory 724 may also store communications procedures (or a set of instructions) in a communication module 728. These communication procedures may be used for communicating with one or more computers, devices and/or servers, including computers, devices and/or servers that are remotely located with respect to the device 700.

Memory 724 may also include one or more program modules 730 (or a set of instructions). Note that one or more of program modules 730 may constitute a computer-program mechanism. Instructions in the various modules in the memory 724 may be implemented in: a high-level procedural language, an object-oriented programming language, and/or in an assembly or machine language. The programming language may be compiled or interpreted, i.e., configurable or configured, to be executed by the one or more processors (or processor cores) 710.

Computer system 700 may include, but is not limited to: a server, a laptop computer, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. For example, chip package(s) 708 may be included in a backplane that is coupled to multiple processor blades, or chip package(s) 708 may couple different types of components (such as processors, memory, I/O devices, and/or peripheral devices). Thus, chip package(s) 708 may perform the functions of: a switch, a hub, a bridge, and/or a router. Note that computer system 700 may be at one location or may be distributed over multiple, geographically dispersed locations.

Chip package 100 (FIGS. 1A and 1B), chip package 200 (FIG. 2A), chip package 250 (FIG. 2B), chip package 300 (FIG. 3A), chip package 330 (FIG. 3B), chip package 360 (FIG. 3C), chip package 380 (FIG. 3D), chip package 400 (FIG. 4A), chip package 450 (FIG. 4B), chip package 500 (FIG. 5), electronic device 600 (FIG. 6) and/or computer system 700 may include fewer components or additional components. For example, referring back to FIG. 1A, semiconductor dies 110 in stack 116 may have different thicknesses or widths. In order to maintain a constant angle 124 for ramp component 112 relative to the surfaces of optional substrate 130 and semiconductor dies 110, the offsets in the horizontal positions of thicker semiconductor dies 110 may be larger than the offsets in the horizontal positions of thinner semiconductor dies 110.

Furthermore, a number of enhancements may be employed to improve power distribution from optional substrate 130 and semiconductor dies 110. Conventional wire bonds may be used in combination with ramp component 112 to connect optional substrate 130 and semiconductor dies 110. Some of the semiconductor dies 110 and/or ramp component 112 may include a thick top metal layer or a redistributed layer (RDL) after initial silicon fabrication to lower the resistivity of the power-distribution network. Additionally, ramp component 112 may include additional supply decoupling capacitors, for example, by fabricating the capacitors on a silicon die or by soldering discrete capacitors to its back surface and using TSVs or, in another technique, to electrically connect the discrete capacitors to the power-supply delivery or regulation circuits. Power may also be delivered through an actively regulated network. For example, circuits, such as buck converters or capacitor-to-capacitor converters, may be included on ramp component 112 and/or optional substrate 130 to improve the quality of the power supply delivered to semiconductor dies 110.

Moreover, although these devices and systems are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. Furthermore, features in two or more of the preceding embodiments may be combined with one another.

Note that some or all of the functionality of electronic device 600 (FIG. 6) and/or computer system 700 may be implemented in one or more application-specific integrated circuits (ASICs) and/or one or more digital signal processors (DSPs). Furthermore, functionality in the preceding embodiments may be implemented more in hardware and less in software, or less in hardware and more in software, as is known in the art.

While the preceding embodiments uses semiconductor dies 110 (such as silicon) in the chip packages, in other embodiments a different material than a semiconductor may be used as the substrate material in one or more of these chips.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A chip package, comprising:
a set of semiconductor dies arranged in a stack in a vertical direction, which is substantially perpendicular to a plane that is parallel to a first semiconductor die in the vertical stack, wherein a given semiconductor die, after the first semiconductor die, is offset in a horizontal direction in the plane by an offset value from an immediately preceding semiconductor die in the vertical stack, thereby defining a stepped terrace at one side of the vertical stack; and
a ramp component, electrically and mechanically coupled to the semiconductor dies, wherein the ramp component is positioned on the one side of the vertical stack, and
wherein the ramp component is approximately parallel to a direction along the stepped terrace, which is between the horizontal direction and the vertical direction, wherein one or more of the semiconductor dies include at least one mechanical stop that protrudes in the vertical direction from a surface of the at one or more semiconductor dies that is parallel to the plane, wherein a side of the ramp component that is approximately parallel to the direction along the stepped terrace rests on the at least one mechanical stop, and wherein the mechanical stops facilitate assembly of the chip package.

2. The chip package of claim 1, wherein the ramp component is a passive component.

3. The chip package of claim 2, wherein the passive component includes a plastic substrate with metal traces to electrically couple to the semiconductor dies.

4. The chip package of claim 1, wherein the ramp component is another semiconductor die.

5. The chip package of claim 1, wherein the ramp component includes an edge connector that is configured to remateably electrically and mechanically couple to a circuit board.

6. The chip package of claim 1, further comprising encapsulation surrounding the semiconductor dies and at least a portion of the ramp component.

7. The chip package of claim 1, wherein the ramp component is soldered to each of the semiconductor dies.

8. The chip package of claim 7, wherein the semiconductor dies include bumps that facilitate soldering of the ramp component to the semiconductor dies, wherein height and pitch of the bumps varies among the semiconductor dies along the vertical direction.

9. The chip package of claim 1, wherein the ramp component is electrically coupled to each of the semiconductor dies by microsprings.

10. The chip package of claim 1, wherein the ramp component is electrically coupled to each of the semiconductor dies by an anisotropic conductive film.

11. The chip package of claim 10, wherein the semiconductor dies include compression elements on top surfaces of the semiconductor dies that compress the anisotropic conductive film when the chip package is assembled, thereby facilitating the electrical coupling between the semiconductor dies and the ramp component.

12. The chip package of claim 1, wherein the ramp component is mechanically coupled to the semiconductor dies without inserting the semiconductor dies into slots in the ramp component.

13. The chip package of claim 1, wherein the electrical coupling between the ramp component and a given semiconductor die in the semiconductor dies has a complex impedance, which includes an in-phase component and an out-of-phase component.

14. The chip package of claim 1, wherein the ramp component facilitates communication of electrical signals and power signals to the semiconductor dies without through-chip vias in the semiconductor dies.

15. The chip package of claim 1, further comprising an intermediate chip between at least two of the semiconductor dies in the vertical stack, wherein the intermediate chip is configured to transport heat generated by operation of at least one of the semiconductor dies along the horizontal direction.

16. The chip package of claim 1, wherein surfaces of the semiconductor dies include etch pits; and
wherein balls in the etch pits maintain relative alignment of the semiconductor dies in the vertical stack.

17. A computer system, comprising a chip package, wherein the chip package includes:
a set of semiconductor dies arranged in a stack in a vertical direction, which is substantially perpendicular to a plane that is parallel to a first semiconductor die in the vertical stack, wherein a given semiconductor die, after the first semiconductor die, is offset in a horizontal direction in the plane by an offset value from an immediately preceding semiconductor die in the vertical stack, thereby defining a stepped terrace at one side of the vertical stack; and
a ramp component, electrically and mechanically coupled to the semiconductor dies, wherein the ramp component is positioned on the one side of the vertical stack, and
wherein the ramp component is approximately parallel to a direction along the stepped terrace, which is between the horizontal direction and the vertical direction, wherein one or more of the semiconductor dies include at least one mechanical stop that protrudes in the vertical direction from a surface of the at one or more semiconductor dies that is parallel to the plane, wherein a side of the ramp component that is approximately parallel to the direction along the stepped terrace rests on the at least one mechanical stop, and wherein the mechanical stops facilitate assembly of the chip package.

18. An electronic device comprising a chip package, wherein the chip package includes:
a set of semiconductor dies arranged in a stack in a vertical direction, which is substantially perpendicular to a plane that is parallel to a first semiconductor die in the vertical stack, wherein a given semiconductor die, after the first semiconductor die, is offset in a horizontal direction in the plane by an offset value from an immediately preceding semiconductor die in the vertical stack, thereby defining a stepped terrace at one side of the vertical stack; and a ramp component, electrically and mechanically coupled to the semiconductor dies, wherein the ramp component is positioned on the one side of the vertical stack, and wherein the ramp component is approximately parallel to a direction along the stepped terrace, which is between the horizontal direction and the vertical direction, wherein one or more of the semiconductor dies include at least one mechanical stop that protrudes in the vertical direction from a surface of the at one or more semiconductor dies that is parallel to the plane, wherein a side of the ramp component that is approximately parallel to the direction along the stepped terrace rests on the at least one mechanical stop, and wherein the mechanical stops facilitate assembly of the chip package.

19. The chip package of claim 1, wherein the semiconductor dies are pushed against the ramp component along the horizontal direction so that the side of the ramp component that is approximately parallel to the direction along the stepped terrace is in mechanical contact with the at least one mechanical stop, and wherein the mechanical stop does not provide an electrical contact.

20. The chip package of claim 1, further comprising a substrate under the first semiconductor die, which is approximately parallel to the plane, wherein the substrate is at least electrically coupled to the ramp component by using a microspring, and wherein the ramp component does not touch the substrate.

* * * * *